United States Patent
Fan

(10) Patent No.: US 6,236,564 B1
(45) Date of Patent: May 22, 2001

(54) DETACHABLE FAN RACK MOUNTING STRUCTURE

(75) Inventor: Cheng-Yuan Fan, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 0 days.

(21) Appl. No.: 09/572,068

(22) Filed: May 17, 2000

(51) Int. Cl.$^7$ .................................................. H05T 7/20
(52) U.S. Cl. .................... 361/695; 361/690; 185/80.3; 174/16.1; 312/236; 454/184; 415/213.1
(58) Field of Search .................................. 361/676–678, 361/690–695, 704; 174/16.1; 165/80.3, 104.34, 185; 454/184; 312/223.1, 223.2, 236; 415/213.1

(56) References Cited

U.S. PATENT DOCUMENTS

| | | | |
|---|---|---|---|
| 4,383,286 | * | 5/1983 | Hicks ..................................... 361/695 |
| 5,208,730 | * | 5/1993 | Tracy ..................................... 361/687 |
| 5,680,295 | * | 10/1997 | Le et al. ................................. 361/695 |
| 5,721,670 | * | 2/1998 | Cochrane et al. ..................... 361/695 |
| 5,788,566 | * | 8/1998 | McAnally et al. .................... 454/184 |
| 6,061,237 | * | 5/2000 | Sands et al. ........................... 361/695 |
| 6,075,698 | * | 6/2000 | Hogan et al. ......................... 361/695 |
| 6,084,774 | * | 7/2000 | Talbot et al. .......................... 361/704 |

\* cited by examiner

Primary Examiner—Leo P. Picard
Assistant Examiner—Boris L. Chervinsky
(74) Attorney, Agent, or Firm—Dougherty & Troxell

(57) ABSTRACT

A detachable fan rack mounting structure includes a mounting frame fixedly fastened to a disk drive rack, and a fan rack detachably mounted on the mounting frame to hold at least one fan, wherein the mounting frame has a top hook and two protruded portions disposed at a top side, a plug hole and a retaining hole disposed near a bottom side, and a female connector spaced above the retaining hole; the fan rack has a springy hook and two locating notches disposed at a top side and respectively forced into engagement with the top hook and protruded portions at the mounting frame, a bottom plug flange and a positioning block respectively engaged into the plug hole and retaining hole on the mounting frame, and a female connector, which is automatically connected to the male connector at the mounting frame after installation of the fan rack in the mounting frame.

2 Claims, 5 Drawing Sheets

DETACHABLE FAN RACK MOUNTING STRUCTURE

BACKGROUND OF THE INVENTION

The present invention relates to a fan rack mounting structure, and more particularly to a detachable fan rack mounting structure, which enables a fan rack to be quickly and detachably mounted on a mounting frame at the back side of a disk drive rack.

A regular disk drive rack has at least one fan rack mounted on its back side to hold a plurality of fans for dissipation of heat. Before mounting the fan rack on the disk drive rack, each fan is connected to the power circuit of the disk drive in the disk drive rack. In case one fan fails to function well, the fan or fans are disconnected with the fan rack from the disk drive rack, and then a soldering gun is used to melt the contacts between the power line of the failed fan and the power circuit of the disk drive in the disk drive rack, enabling the power line of the failed fan to be disconnected from the power circuit of the disk drive in the disk drive rack. The fan rack mounting arrangement complicates the maintenance and repair work of the fans.

SUMMARY OF THE INVENTION

The present invention has been accomplished to provide a detachable fan rack mounting structure, which eliminates the aforesaid problem. According to one aspect of the present invention, the detachable fan rack mounting structure comprises a mounting frame fixedly fastened to a disk drive rack, and a fan rack detachably mounted on the mounting frame to hold at least one fan, wherein the mounting frame comprises a top hook and two protruded portions disposed at a top side, and a plug hole and a retaining hole disposed near a bottom side; the fan rack comprises a springy hook and two locating notches disposed at a top side and respectively forced into engagement with the top hook and protruded portions at the mounting frame, and a bottom plug flange and a positioning block respectively engaged into the plug hole and retaining hole on the mounting frame. According to another aspect of the present invention, the mounting frame further comprises a female connector spaced connected to the power circuit of the disk drive in the disk drive rack, and the fan rack further comprises a female connector, which is automatically connected to the male connector at the mounting frame after installation of the fan rack in the mounting frame.

DETAILED DESCRIPTION OF THE PREFERRED EMBODIMENT

Figure 1:
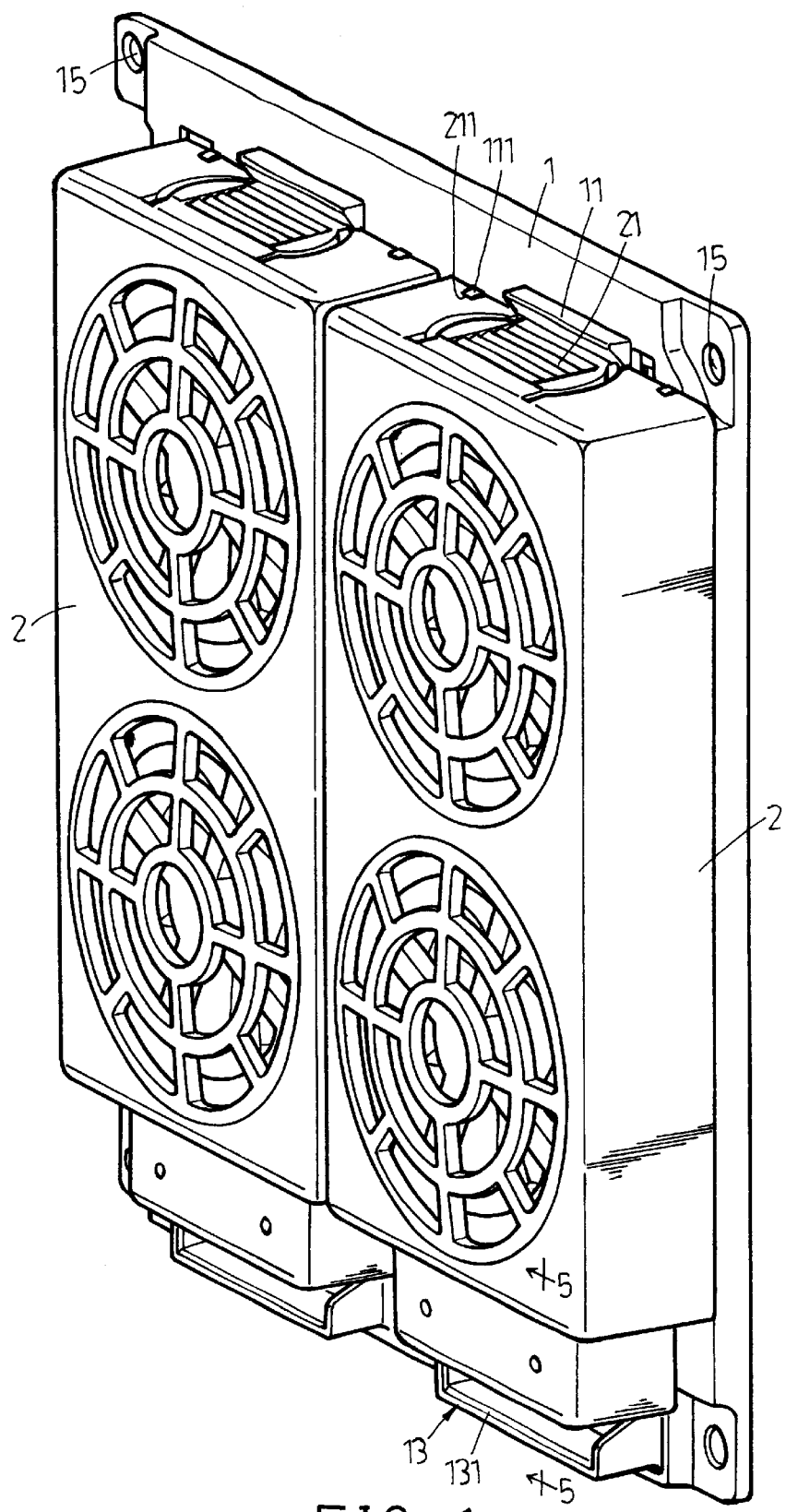
FIG. 1 is a perspective view of a detachable fan rack mounting structure according to the present invention.
Figure 2:
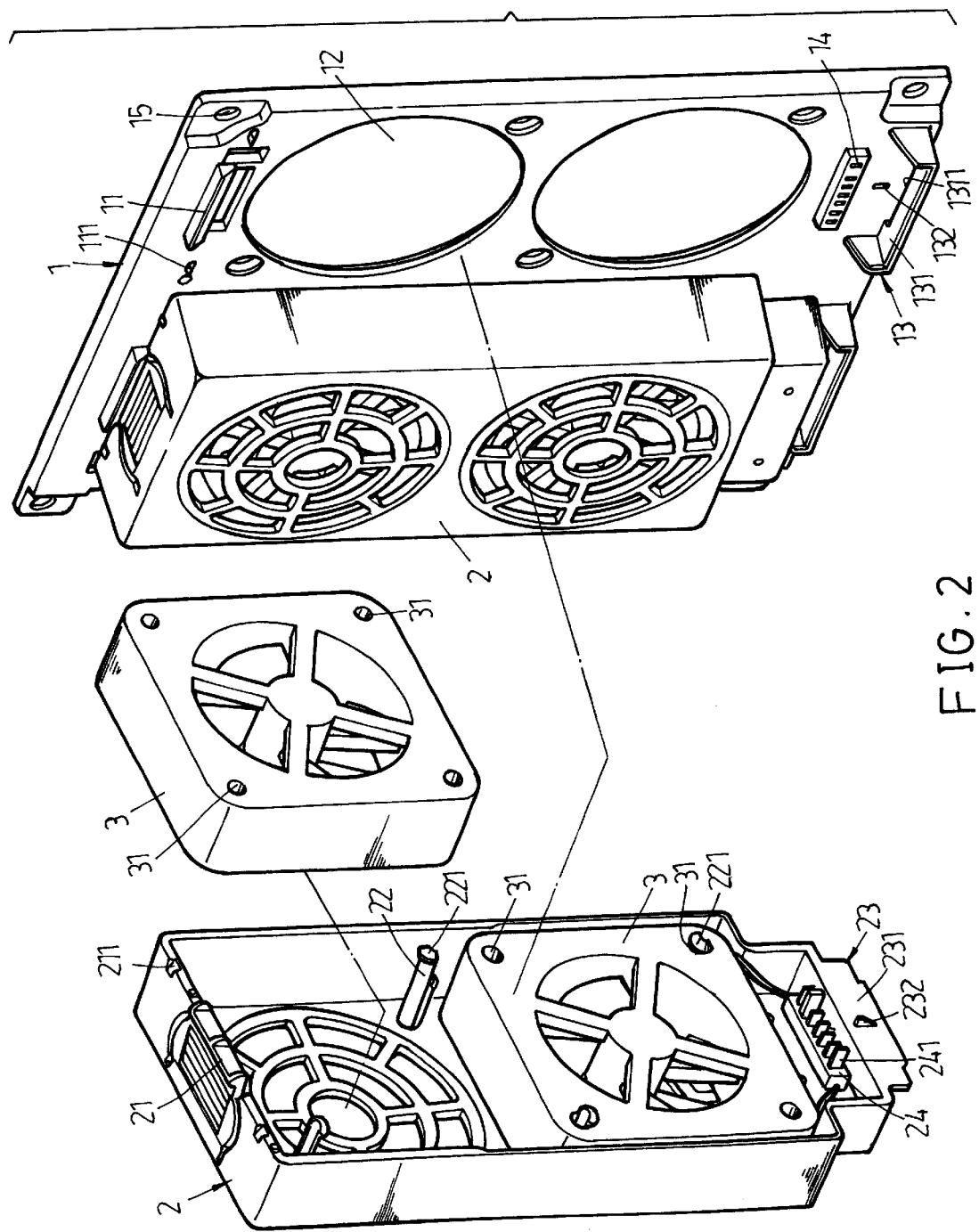
FIG. 2 is an exploded view of the detachable fan rack mounting structure shown in FIG. 1.
Figure 3:
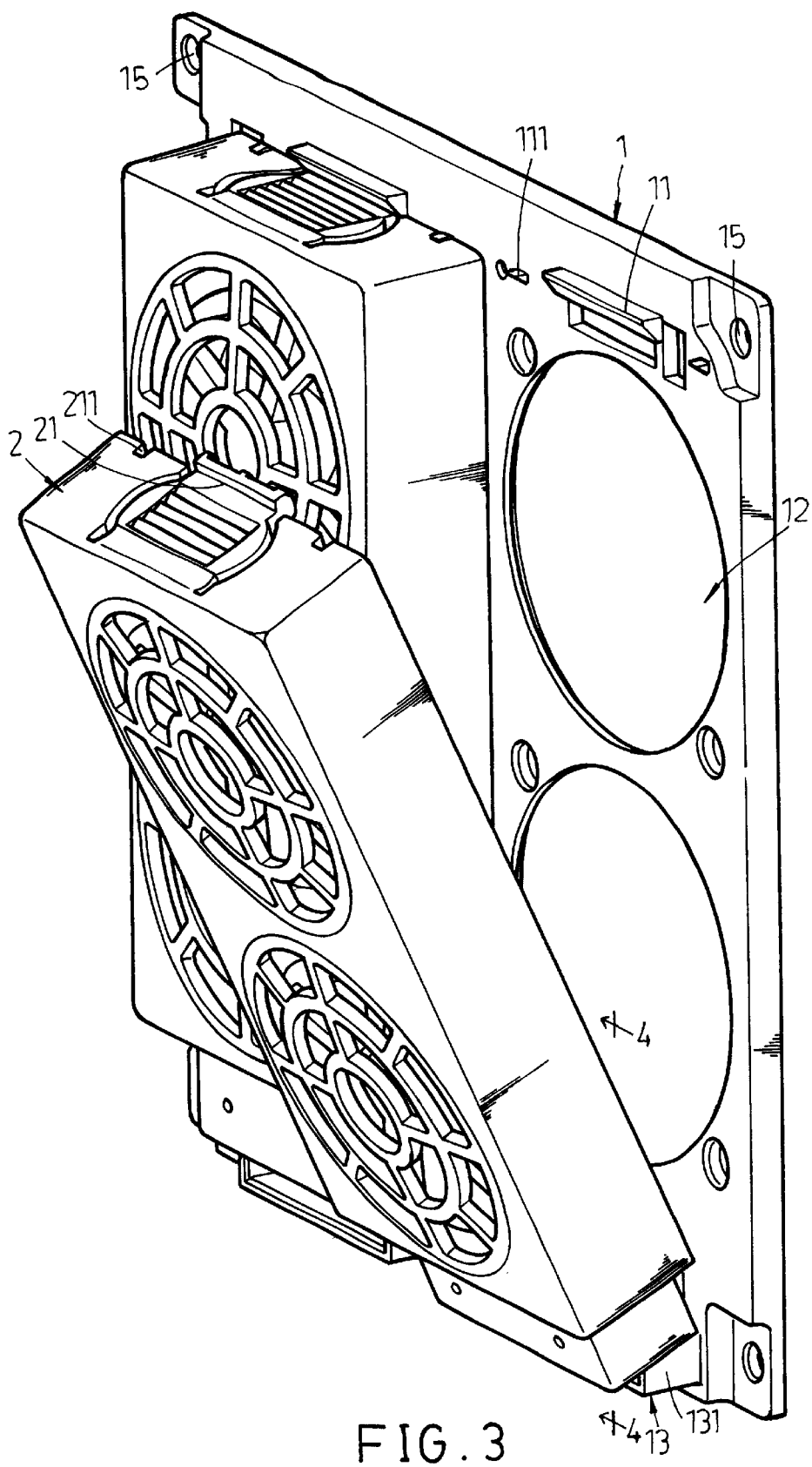
FIG. 3 illustrates
Figure 4:
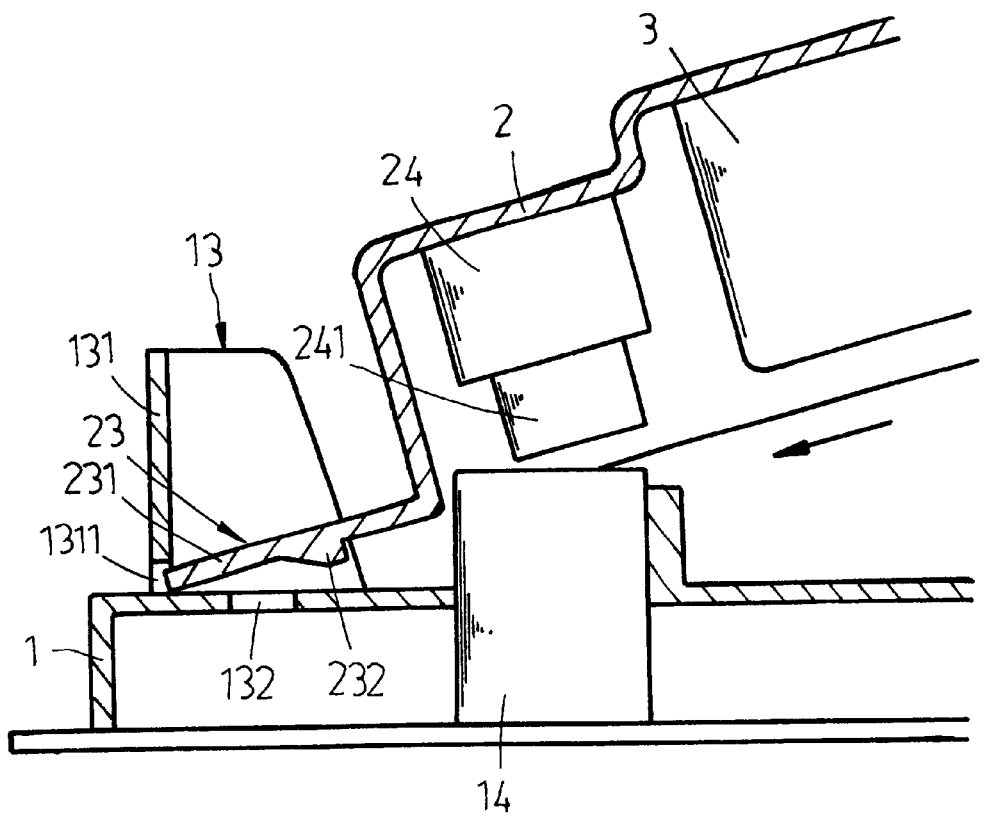
FIG. 4 is a sectional view taken along line 4—4 of FIG. 4.
Figure 5:
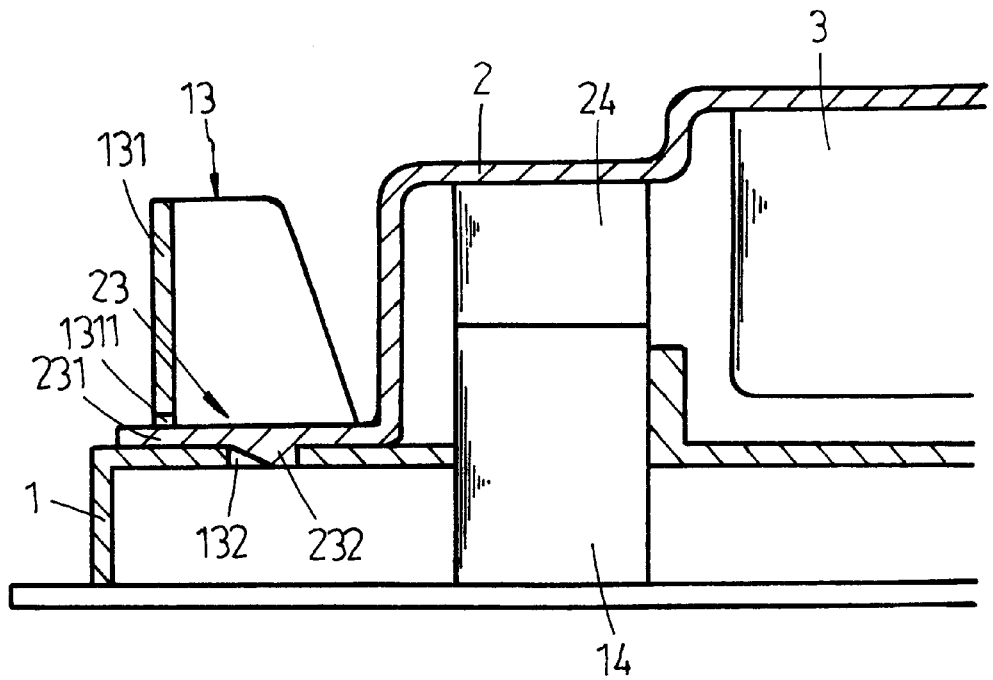
FIG. 5 is a sectional view taken along line 5—5 of FIG. 1.
Figure 6:
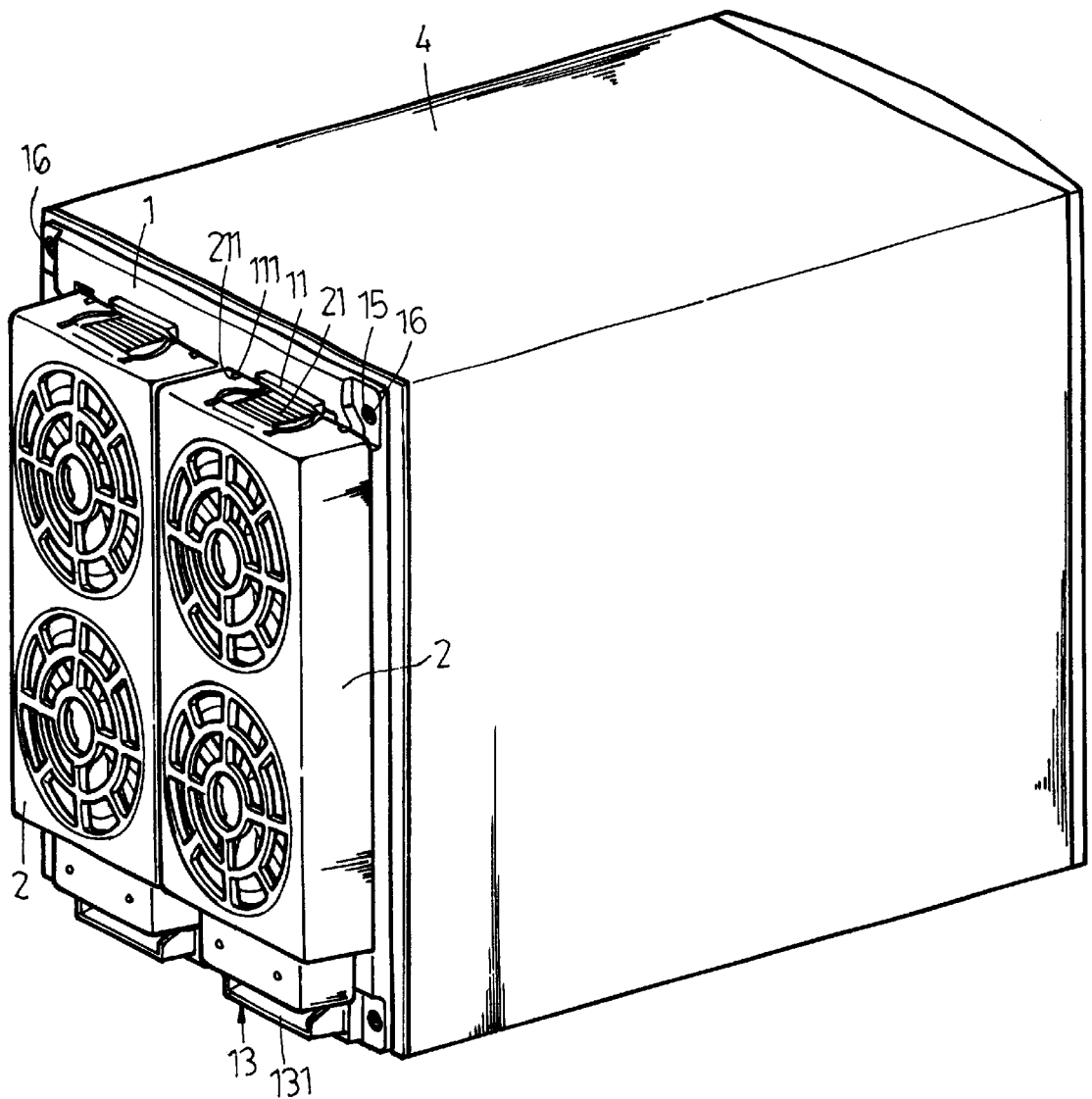
FIG. 6 is an application example of the present invention, showing the detachable fan rack mounting structure installed in a disk drive rack.

Referring to FIGS. from 1 through 3 and FIG. 6, a detachable fan rack mounting structure in accordance with the present invention comprises a mounting frame 1 fixedly mounted on the back side of a disk drive rack 4, and at least one, for example, two rectangular fan racks 2 detachably mounted on the mounting frame 1 to hold a respective pair of fans 3. The mounting frame 1 comprises a plurality of mounting holes 15 respectively disposed in the corners thereof and fixedly fastened to the back side of the disk drive rack 4 by screws 16, and two fan rack receiving units 12 for receiving the fan racks 2. Each fan rack receiving unit 12 comprises a hook 11 disposed near the top side, two protruded portions 111 horizontally equally spaced from the top hook 11 at two sides, a fan rack positioning structure 13 disposed near the bottom side, and a female connector 14 spaced above the fan rack positioning structure 13. The fan rack positioning structure 13 comprises a U-plate 131, a plug hole 1311 through the U-shaped plate 131, and a retaining hole 132 spaced between the U-plate 131 and the female connector 14. Each fan rack 2 comprises a plurality of springy retainer rods 22 corresponding to the mounting holes 31 on each fan 3. Each springy retainer rod 22 has its free end terminating in a flanged retaining portion 221. After insertion of the springy retainer rods 22 into the mounting holes 31 on each fan 3, the flanged retaining portion 221 of each springy retainer rod 22 is maintained engaged with the bottom side wall of the corresponding fan 3, and therefore the fans 3 are secured to the fan rack 2. When disconnecting one fan 3 from the corresponding fan rack 2, the flanged retaining portion 221 of each springy retainer rod 22 is moved with the fingers and disengaged from the bottom side wall of the corresponding fan 3. Each fan rack 2 further comprises a springy hook 21 and two locating notches 211 disposed at a top side for engagement with the hook 11 and protruded portions 111 of the corresponding fan rack receiving unit 12, a bottom positioning structure 23 for coupling to the fan rack positioning structure 13 of the corresponding fan rack receiving unit 12, and a male connector 24 spaced above the bottom positioning structure 23 for connection to the female connector 14 at the corresponding fan rack receiving unit 12. The bottom positioning structure 23 comprises a plug flange 231 for engaging into the plug hole 1311 on the U-plate 131 of the fan rack positioning structure 13 at the corresponding fan rack receiving unit 12, and a positioning block 232 for engaging into the retaining hole 132 of the fan rack positioning structure 13 at the corresponding fan rack receiving unit 12.

Referring to FIGS. from 3 through 5, when mounting one fan rack 2 on one fan rack receiving unit 12 at the mounting frame 1, the plug flange 231 of the bottom positioning structure 23 is inserted into the plug hole 1311 on the U-plate 131 of the fan rack positioning structure 13, and then the fan rack 2 is moved toward the corresponding fan rack receiving unit 12 to force the grounding terminals 241 of the male connector 24 into the corresponding female connector 14 and the positioning block 232 into the retaining hole 132 of the corresponding fan rack positioning structure 13, enabling the male connector 24 and the female connector 14 to be electrically connected, and then the fan rack 2 is closed on the corresponding fan rack receiving unit 12 to force the springy hook 21 and the two locating notches 211 into engagement with the hook 11 and protruded portions 111 of the corresponding fan rack receiving unit 12. When removing one fan rack 2 from the corresponding fan rack receiving unit 12, the springy hook 21 is pulled with the fingers and disengaged from the hook 11 at the corresponding fan rack receiving unit 12, and then the fan rack 2 is turned outwards from the mounting frame 1 to disengage the male connector 24 and the positioning block 232 from the female connector 14 and retaining hole 132 of the corresponding fan rack positioning structure 13, and then the fan rack 2 is pulled outwards from the mounting frame 1 to disconnect the plug flange 231 from the plug hole 1311 on the U-plate 131 of the fan rack positioning structure 13.

While only one embodiment of the present invention has been shown and described, it will be understood that various modifications and changes could be made thereunto without departing from the spirit and scope of the invention disclosed.

What the invention claimed is:

1. A detachable fan rack mounting structure comprising:

a mounting frame fixedly fastened to a back side of a disk, drive rack, said mounting frame comprising a top hook near a top side thereof, two protruded portions horizontally equally spaced from said top hook at two sides, a fan rack positioning structure disposed near a bottom side thereof, and a female connector spaced above said fan rack positioning structure, said fan rack positioning structure comprises a U-plate, a plug hole through said U-shaped plate, and a retaining hole spaced between said U-plate and said female connector;

a detachable fan rack mounted on said mounting frame to hold at least one fan, said detachable fan rack comprising a springy hook and two locating notches disposed at a top side thereof and engaged with the top hook and protruded portions at said mounting frame, a bottom positioning structure coupled to the fan rack positioning structure at said mounting frame, and a male connector spaced above said bottom positioning structure and connected to the female connector at said mounting frame, said bottom positioning structure comprising a plug flange for engaging into the plug hole of the fan rack positioning structure at said mounting frame, and a positioning block for engaging into the retaining hole of the fan rack positioning structure at said mounting frame.

2. The detachable fan rack mounting structure of claim 1 wherein said fan rack further comprises a plurality of springy retainer rods for insertion into respective mounting holes on at least one fan for enabling at least one fan to be secured to said fan rack.

* * * * *